(12) United States Patent
Katti

(10) Patent No.: US 8,415,775 B2
(45) Date of Patent: Apr. 9, 2013

(54) MAGNETIC SHIELDING FOR MULTI-CHIP MODULE PACKAGING

(75) Inventor: Romney R. Katti, Shorewood, MN (US)

(73) Assignee: Honeywell International Inc., Morristown, NJ (US)

( * ) Notice: Subject to any disclaimer, the term of this patent is extended or adjusted under 35 U.S.C. 154(b) by 221 days.

(21) Appl. No.: 12/953,133

(22) Filed: Nov. 23, 2010

(65) Prior Publication Data
US 2012/0126382 A1 May 24, 2012

(51) Int. Cl.
*H01L 23/552* (2006.01)
(52) U.S. Cl. ......... 257/659; 257/E23.114; 257/E21.499; 438/109
(58) Field of Classification Search ............. 257/659, 257/E23.114, E21.499; 438/109
See application file for complete search history.

(56) References Cited

U.S. PATENT DOCUMENTS

| | | | |
|---|---|---|---|
| 6,452,253 B1 | 9/2002 | Tuttle | |
| 6,515,352 B1 | 2/2003 | Spielberger et al. | |
| 6,559,521 B2 | 5/2003 | Tuttle | |
| 6,567,299 B2 | 5/2003 | Kunikiyo et al. | |
| 6,664,613 B2 | 12/2003 | Tuttle | |
| 6,717,241 B1 | 4/2004 | Tuttle | |
| 6,906,396 B2 | 6/2005 | Tuttle et al. | |
| 6,916,668 B2 | 7/2005 | Spielberger et al. | |
| 6,924,168 B2 | 8/2005 | Tuttle | |
| 6,936,763 B2 | 8/2005 | Rizzo et al. | |
| 6,940,153 B2 | 9/2005 | Spencer et al. | |
| 6,962,833 B2 | 11/2005 | Tuttle et al. | |
| 7,030,469 B2 | 4/2006 | Mahadevan et al. | |
| 7,057,249 B2 | 6/2006 | Anthony et al. | |
| 7,119,419 B2 | 10/2006 | Kato et al. | |
| 7,183,617 B2 | 2/2007 | Wang et al. | |
| 7,205,643 B2 | 4/2007 | Smith | |
| 7,459,769 B2 | 12/2008 | Kato et al. | |
| 7,489,015 B2 | 2/2009 | Stobbs | |
| 7,569,915 B2 | 8/2009 | Spielberger et al. | |
| 7,772,679 B2 | 8/2010 | Chang et al. | |
| 7,796,399 B2 | 9/2010 | Clayton et al. | |
| 7,829,980 B2 * | 11/2010 | Molla et al. | 257/659 |
| 2008/0122047 A1 | 5/2008 | Honer et al. | |
| 2008/0197434 A1 | 8/2008 | Kato et al. | |
| 2009/0050992 A1 | 2/2009 | Kools et al. | |
| 2010/0164076 A1* | 7/2010 | Lee et al. | 257/659 |
| 2010/0164077 A1 | 7/2010 | Bando et al. | |
| 2012/0025354 A1* | 2/2012 | Sasaki et al. | 257/620 |

* cited by examiner

*Primary Examiner* — Trung Q Dang
(74) *Attorney, Agent, or Firm* — Shumaker & Sieffert, P.A.

(57) ABSTRACT

A system comprises a plurality of stacked integrated circuit dice, each integrated circuit die comprising at least one circuit, a package enclosing the plurality of dice, and at least two magnetic shields configured to magnetically shield the at least one circuit of each of the plurality of integrate circuit dice. At least one of the magnetic shields is within the package, and at least two of the plurality of stacked integrated circuit dice are positioned between the at least two magnetic shields.

20 Claims, 4 Drawing Sheets

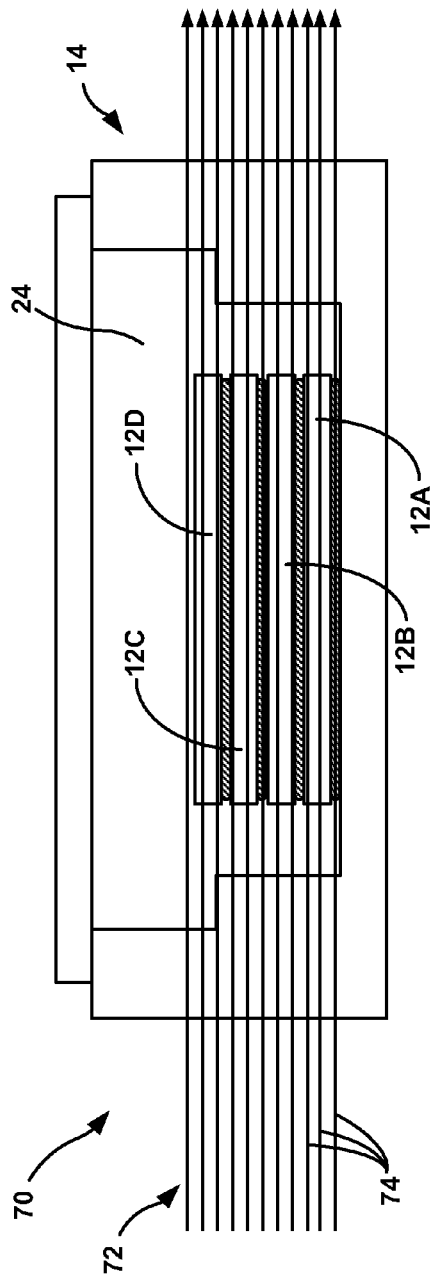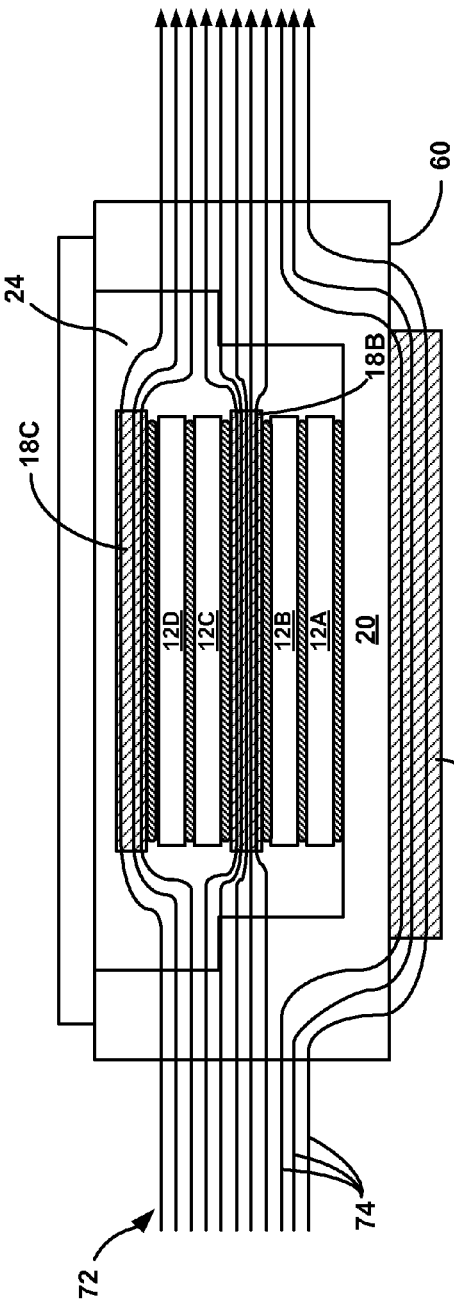

MAGNETIC SHIELDING FOR MULTI-CHIP MODULE PACKAGING

TECHNICAL FIELD

The disclosure relates to electronics devices, and, more particularly, magnetic shielding of electronics devices.

BACKGROUND

Magnetically-sensitive circuits can be used in many electronics devices, such as, for example, in magnetic cell memories and magnetic field sensors. For example, in magnetoresistive random access memory (MRAM) devices, data is written to the device by applying magnetic fields to memory cells so that magnetically-sensitive material in the cells will be magnetized into either of two possible memory states. Data is read from the device by sensing the resistance through the memory cells, which changes depending on which of the two memory states the magnetically sensitive material is in.

SUMMARY

In general, the disclosure is directed to magnetic shielding of electronics devices, such as those comprising one or more magnetically sensitive circuits. In one example, a system includes magnetic shields and an electronics device comprising a plurality of integrated circuit dice, such as a multi-chip module (MCM) package. The electronics device may include, for example, a plurality of stacked integrated circuit dice that are substantially enclosed by a package. In one example, at least one magnetic shield is disposed within the package, and at least two of the plurality of stacked integrated circuit dice in the package are positioned between magnetic shields.

In one aspect, the disclosure is directed to a system comprising a plurality of stacked integrated circuit dice, each integrated circuit die comprising at least one circuit, a package enclosing the plurality of dice, and at least two magnetic shields configured to provide shielding for the at least one circuit of each of the plurality of integrate circuit dice, wherein at least one of the magnetic shields is within the package, and wherein at least two of the plurality of stacked integrated circuit dice are positioned between the at least two magnetic shields.

In another aspect, the disclosure is directed to a method comprising stacking a plurality of integrated circuit dice, each integrated circuit die comprising at least one circuit, enclosing the stacked plurality of integrated circuit dice within a package, and placing at least two magnetic shields to provide shielding for the at least one circuit of each of the plurality of integrated circuit dice, wherein at least one of the magnetic shields is placed within the package, and wherein at least two of the plurality of stacked integrated circuit dice are positioned between the at least two magnetic shields.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIG. 4A is a schematic cross-sectional view of an example package without magnetic shields, and illustrates a magnetic field passing through the integrated circuit dice of a multi-chip module stack.

FIG. 4B is a schematic cross-sectional view of an example package with magnetic shields in accordance with examples described herein, and illustrates a magnetic field being drawn into magnetic shields.

DETAILED DESCRIPTION

In general, this disclosure is directed to an electronics device that includes magnetic shielding. The magnetic shielding of the electronics device described in this disclosure allow integrated circuit (IC) die comprising magnetically-sensitive circuits to be stacked in a multi-chip module (MCM) while still maintaining a specified degree of immunity from stray magnetic fields. The specified degree of immunity may be, for example, immunity against a magnetic flux that is strong enough to compromise the integrity of the magnetically-sensitive circuits. The configuration of magnetic shields described herein may allow for increased volumetric efficiency over single-chip packages and decreased mass compared to devices that include a 1:1 or greater ratio of magnetic shields to IC die, while still providing sufficient protection against stray magnetic fields. In addition, the magnetic shields are configured to allow interconnections between the IC to be made.

In one example, a system may include a plurality of stacked IC dice, each integrated circuit die comprising at least one circuit, a package configured to receive the plurality of IC dice, and at least two magnetic shields configured to provide shielding for the at least one circuit of each of the plurality of integrate circuit dice, wherein at least one of the magnetic shields is within the package, and wherein at least two of the plurality of stacked integrated circuit dice are positioned between the at least two magnetic shields. The configuration of the magnetic shields, such as the length, width, and thickness, may be selected based on the desired magnetic flux, also referred to as magnetic field strength, to be protected against. The magnetic shields are configured to accommodate electrical connections between the IC dice and external circuitry, such as through a connection with the package.

Figure 1:
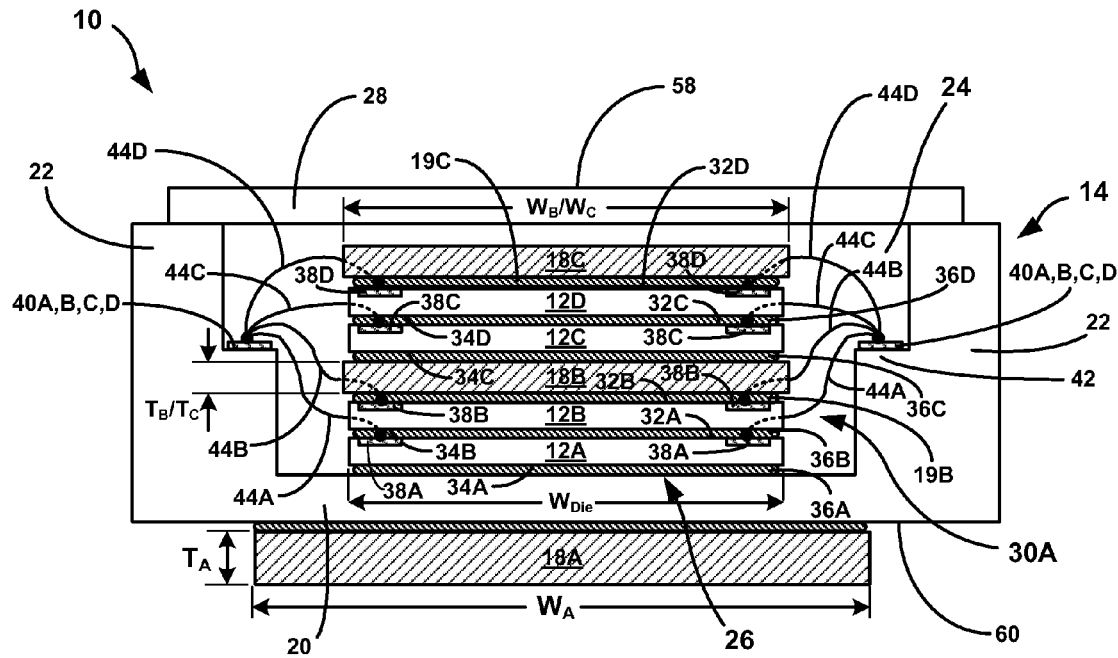
FIG. 1 is a schematic cross-sectional view of a system comprising magnetic shields and an example electronics device comprising a multi-chip module stack of integrated circuit dice.
Figure 2:
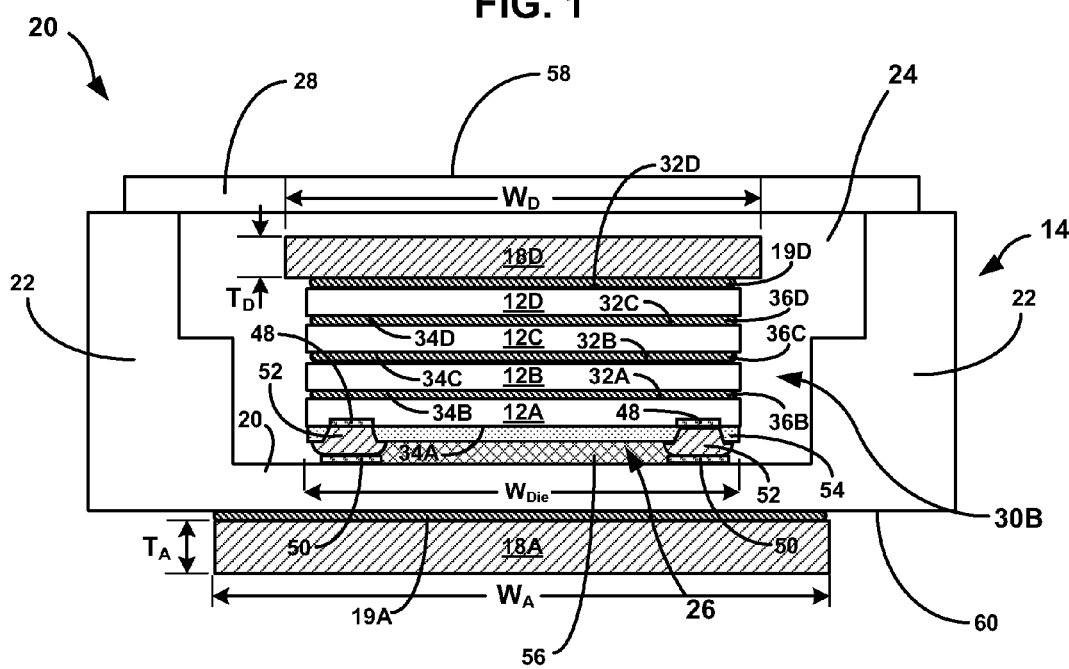
FIG. 2 is a schematic cross-sectional view of another example electronics device comprising magnetic shields and a multi-chip module stack of integrated circuit dice.
Figure 3:
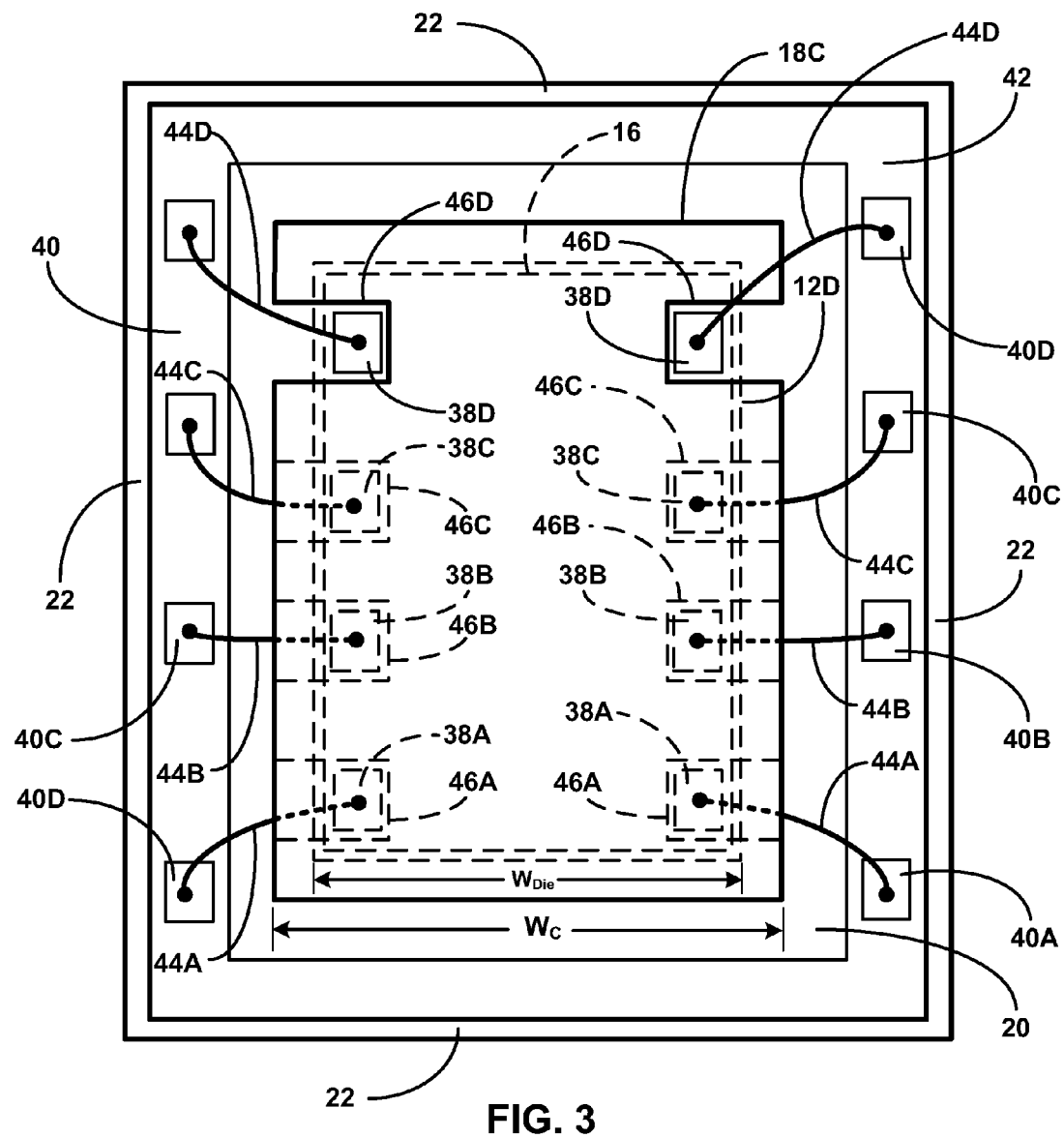
FIG. 3 is a schematic elevation view of the example electronics device of FIG. 1.

FIGS. 1-3 are schematic cross-sectional diagrams of example electronics devices 10, 20 comprising a plurality of stacked integrated circuit (IC) dice 12A, 12B, 12C, 12D (collectively referred to herein as "IC die 12," "die 12," "IC dice 12," or "dice 12") disposed in a package 14. Each IC die 12 comprises at least one circuit 16 (shown conceptually in FIG. 3). Although FIG. 3 shows circuit(s) 16 having a footprint that extends to the edge of IC die 12D or substantially close to the edge, one or more circuits 16 may have a smaller footprint such that the respective circuit 16 is only located in a portion of each IC die 12 and does not extend from edge to edge of the respective IC die 12.

In one example, circuit(s) 16 of each die 12 comprises at least one magnetically-sensitive circuit 16 comprising a magnetically-sensitive material. The magnetically-sensitive material may be affected by magnetic fields in or around device 10. Dice 12 shown in FIGS. 1-3 are a simplified representation, and each die 12 may include additional features or layers in some examples, such as a device layer, one or more interconnect and dielectric layers, and a passivation layer. In one example, the magnetically-sensitive circuit 16 comprises a magnetoresistive random access memory (MRAM) circuit comprising an array of memory cells each comprising a magnetically-sensitive material that may be magnetized into either of two possible memory states. The MRAM circuits may have any suitable memory storage capacity, such as 1 megabyte (MB) or 16 MB.

MRAM is a non-volatile memory technology. A MRAM circuit stores data as a magnetic state in a magnetic storage element, or memory cell. In some examples, an MRAM cell includes two ferromagnetic layers, each of which can hold a magnetic field that has one of two possible polarities. The logic state of the MRAM cell may depend on the polarity of the ferromagnetic layers. For example, if the ferromagnetic layers have the same polarity, the MRAM cell may be storing a "0." If the ferromagnetic layers have an opposite polarity, the MRAM cell may be storing a "1." Example MRAM cells include a pseudo spin valve (PSV) MRAM cell, which may include two magnetic layers of different thicknesses, separated by a nonmagnetic conductive spacer layer, a spin valve (SV) MRAM cell, which may also include two magnetic layers separated by a nonmagnetic conductive spacer layer (e.g., Cu), and a magnetic tunnel junction (MTJ) MRAM cell, which may include a free magnetic layer that stores data and a pinned magnetic layer, where the magnetic layers are separated by a nonmagnetic insulating barrier layer.

Examples of MRAM memory cell arrays are described in U.S. Pat. No. 7,539,047 to Romney R. Katti, which is entitled "MRAM CELL WITH MULTIPLE STORAGE ELEMENTS" and issued on Sep. 17, 2009, the disclosure of which is incorporated herein by reference in its entirety. IC dice 12 can also include other MRAM memory cell arrays can also be used in addition to or instead of the MRAM memory cell arrays described in U.S. Pat. No. 7,539,047 to Romney R. Katti.

Circuits 16 may comprise other magnetically-sensitive circuit arrangements, such as magnetic field sensors, or magnetic logic.

Stray magnetic fields may be present in and around electronics devices 10, 20 that include magnetically-sensitive circuits, such as circuits 16. The stray magnetic fields may be generated as part of operation of the device 10, 20 and/or may be generated from an external source. Some stray magnetic fields may have deleterious effects on magnetically-sensitive circuit 16. For example, in an MRAM device, stray magnetic fields having a particular strength may cause the magnetically-sensitive material in the memory cells to spontaneously switch between memory states. Electronics devices 10, may each include magnetic shielding in order to help protect the magnetically-sensitive circuits against the undesirable effects of stray magnetic fields. In the example shown in FIGS. 1 and 2, electronics devices 10, 20 each comprise magnetic shields 18A, 18B, 18C, 18D (collectively referred to as "magnetic shield(s) 18"), that may be mounted in or around electronics device 10, 20, such as with an adhesive 19A, 19B, 19C, 19D, as described in more detail below, in order to help protect IC dice 12 and the respective magnetically-sensitive circuits 16 against undesirable effects of stray magnetic fields. In some examples in which magnetically-sensitive circuits 16 comprise a MRAM circuit, magnetic shields 18 are positioned to protect bit and write lines from stray magnetic fields.

Package 14 has any suitable configuration for receiving the plurality of IC dice 12 and housing IC dice 12. In some examples, package 14, together with lid 28, help protect IC dice 12 from environmental contaminants, and, in some examples, package 14 and/or lid 28 are thermally conductive to help dissipate heat away from IC dice 12. For example, package 14 and lid 28 may define a hermetically sealed housing for IC dice 12. In the examples of FIGS. 1-3, package 14 is shaped substantially as a rectangular prism having a base 20 with four sides 22 extending from base 20 to form a die cavity 24, which is configured to receive the plurality of stacked dice 12. Base 20 may include a die attach area 26 upon which the plurality of stacked dice 12 may be mounted. Package may also comprise a lid 28 positioned substantially opposite base 20 and engaged with sides 22 to substantially enclose cavity 24. In one example, base 20 and sides 22 are formed together as a single body, which may comprise a plurality of layers stacked or laminated together, while lid 28 may be a separate body that is mounted and mechanically coupled to sides 22, e.g., with an adhesive. In addition, in some examples, a sealing member may be positioned between lid 28 and sides 22 in order to better seal the interface between lid 28 and sides 22.

In the example of FIGS. 1 and 2, the plurality of integrated circuit dice 12 are arranged in a multi-chip module (MCM) chip stack 30A, 30B. MCM stack 30A, 30B each comprise a stack of four dice 12A, 12B, 12C, 12D in the example shown in FIGS. 1 and 2.

In the examples shown in FIGS. 1 and 2, a first integrated circuit die 12A has a first side 32A, which may also be referred to as front side 32A, and a second side 34A, which may also be referred to as back side 34A, wherein back side 34A is mounted on package 14, such as onto die attach area 26 of package base 20. First die 12A may be mounted to package 20 with an adhesive 36A, sometimes referred to as a die attach material 36A. Examples of adhesive materials that may be used as the die attach material 36A include epoxies, and adhesive strips and pre-forms.

A second integrated circuit die 12B is mounted on first die 12A. Second die 12B has a first side 32B, which may also be referred to as front side 32B, and a second side 34B, which may also be referred to as back side 34B, wherein back side 34B is stacked on front side 32A of first die 12A. In some examples, another structure may be stacked on first die 12A between first die 12A and second die 12B, such as a magnetic shield. Second die 12B may be mounted to first die 12A, or to an interlaying structure such as a shield, if present, with an adhesive material 36B, such as one or more epoxies or a pre-form adhesive. In one example, second die 12B may be mounted to first die 12A during the fabrication process, for example by fabricating second die 12B on front side 32A of first die 12A, by placing first die 12A and second die 12B in a back-to-back arrangement, or by sandwiching first die 12A and second die 12B together.

A third integrated circuit die 12C is mounted on second die 12B. Third die 12C has a first side 32C, which may also be referred to as front side 32C, and a second side 34C, which may also be referred to as back side 34C, wherein back side 34C is stacked on front side 32B of second die 12B. In some examples, another structure may be stacked on second die 12B between second die 12B and third die 12C, such as magnetic shield 18B of stack 30A, as shown in FIG. 1. Third die 12C may be mounted to second die 12B, or to an interlaying structure such as magnetic shield 18B, if present, with an adhesive material 36C.

A fourth integrated circuit die 12D is mounted on third die 12C. Fourth die 12D has a first side 32D, which may also be referred to as front side 32D, and a second side 34D, which may also be referred to as back side 34D, wherein back side 34D is stacked on front side 32C of third die 12C. In some examples, another structure may be positioned between third die 12C and fourth die 12D, such as a magnetic shield. Fourth die 12D may be mounted to third die 12C, or to an interlaying structure such as a magnetic shield, if present, with an adhesive material 36D. In some examples, another structure may be mounted on fourth die 12D, such as magnetic shield 18C of stack 30A, shown in FIG. 1, or magnetic shield 18D of stack 30B, shown in FIG. 2.

Although MCM stack 30A of FIG. 1 is described above as being formed by stacking first die 12A on package 14, and then subsequently stacking second die 12B on first die 12A, stacking shield 18B on second die 12B, stacking third die 12C on shield 18B, and stacking fourth die 12D on third die 12C, and stacking shield 18C on fourth die 12D, in other examples, MCM stack 30A may be formed by performing the steps of mounting and stacking in any suitable order. For example, a first subassembly may be formed by mounting second die 12B to first die 12A with adhesive 36B followed by mounting shield 18B to second die 12B with adhesive 19B, and a second subassembly may be formed by mounting fourth die 12D to third die 12C with adhesive 36D followed by mounting shield 18C to fourth die 12D with adhesive 19C.

Stack 30A may be formed by mounting the second subassembly (e.g., third die 12C, fourth die 12D, and shield 18C) onto the first subassembly (e.g., first die 12A, second die 12B, and shield 18B), such as with adhesive 36C, which is positioned between third die 12C and shield 18B, followed by mounting the entire stack 30A onto package 14. Similarly, while MCM stack 30B of FIG. 2 is describe above as being formed by stacking first die 12A on package 14, followed by stacking second die 12B on first die 12A, stacking third die 12C on second die 12B, stacking fourth die 12D on third die 12C, and stacking shield 18D on fourth die 12D, MCM stack 30B may be formed by performing the steps of mounting and stacking in any suitable order.

MCM stack 30A, 30B may be connected to external circuitry, such as a printed board, via package 14. In one example, shown in FIGS. 1 and 3, MCM stack 30A may be connected to package 14 via one or more electrically conductive connection pads 38A, 38B, 38C, 38D (collectively referred to herein as "connection pad(s) 38") located on one or more dice 12. Package 14 may comprise one or more corresponding connection pads 40A, 40B, 40C, 40D (collectively referred to herein as "connection pad(s) 40") located within cavity 24. Connection pads 38 and 40 each provide an area for an electrical connection between MCM stack 30A and package 14, such as via wirebonding using connection wires 44A, 44B, 44C, 44D (collectively referred to herein as "connection wire(s) 44"). In one example, each connection pad 38 of MCM stack 30A is provided on a top-most surface of a respective die 12. For example, connection pad 38D of die 12D may be provided on front surface 32D of fourth die 12D. Package connection pads 40 are located on a shoulder 42 of package sides 22. In another example (not shown), die connection pads may be provided only on one of the dice 12, such as on top-most die 12D, wherein electrically-conductive pathways, such as interconnect layers and/or vias, may be provided to interconnect each die 12 to the connection pads.

Package sides 22 and/or base 20 may include electrically-conductive pathways (not shown) to provide an electrical connection between package connection pads 40 within cavity 24 and external circuitry, such as a printed board (not shown). If a wirebonding connection arrangement is used and if a magnetic shield 18C is positioned upon the same surface that comprises connection pads 38, shield 18C may be configured to provide for electrical connection to connection pads 38. In one example, shown best in FIG. 3, shield 18C comprises one or more cutaways 46D, each corresponding to at least one of the connection pads 38D of top-most die 12D of MCM stack 30A. Additional cutaways 4bA, 46B, 46C may be provided in other structures within stack 30A, such as in shield 18B, adhesive 19B, die attach 36B, or die 12B, to provided access to connection pads 38A, 38B, 38C, respectively.

Each cutaway 46A, 46B, 46C, 46D (collectively referred to herein as "cutaway(s) 46") is configured to expose at least a portion of a corresponding connection pad 38 to allow connection wires 44 access to connection pads 38. In one example, cutaways 46 in shields 18B, 18C are as small as practical to allow access to connection pads 38 in order to minimize a potential pathway for stray magnetic fields to access circuits 16 in dice 12 through cutaways 46. As shown in the example of FIG. 3, cutaways 46 may be generally rectangular in shape such that the sides of cutaways 46 are generally straight. However, other cutaway shapes may also be used, such as generally round, e.g. circular, triangular, or any other shape that is practical. The example of FIG. 3 also shows cutaways 46 extending all the way to an edge of shield 18, however other arrangements are possible. For example, each cutaway may simple be a hole through shield 18 that exposes at least a portion of a corresponding connection pad 38.

Other methods of providing access to connection pads 38 may be used, such as sizing the width $W_c$ of shield 18C to be narrower than the width $W_{Die}$ of die 12D so that connection pads 38 are exposed, or by shaping shield 18C to be thinner and slightly elevated immediately over connection pads 38 to provide room for wires 44 to connect to connection pads 38. In another example, shield 18C may be mounted to die 12D after electrical connection is made between wires 44 and connection pads 38, such that shield 18D overlies connection pads 38 and wires 44.

Other means of connecting the MCM stack to external circuitry may be used. The example device 20 of FIG. 2 comprises a "flip-chip" arrangement for providing electrical connection between MCM stack 30B and package 14. As shown in FIG. 2, MCM stack 30B comprises one or more connection pads 48, while one or more corresponding connection pads 50 are included on package 14. Electrical connection between connection pads 48 of MCM stack 30B and package connection pads 50 is provided via electrically conducting bumps 52, sometimes referred to as solder bumps or solder balls, which may be formed so that bumps 52 are electrically connected to both connection pads 48 and 50. In some examples, a passivation dielectric layer 54 may also be provided over at least a part of back side 34A of first die 12A, where openings are formed through passivation layer 54 to provide access for bumps 52 to connect to connection pads 48. In other examples, other electrical connection techniques can be used to electrically connect MCM 30B to base 20 in addition to or instead of bumps 52.

The term "flip-chip" refers to the stack 30B and each individual die 12, being flipped upside down relative to the arrangement shown in FIG. 1, such that stack 30B electrically connects to connection pads 50 via connection pads 48 and conducting bumps 52. In one example, after MCM stack 30B has been flipped, the material of conduction bumps 52 may be partially melted via a thermal process so that conduction bumps 52 form both an electrical and mechanical connection between connection pads 48 of MCM stack 30B and package conduction pads 50. In some examples, an underfill or adhesive material 56 may fill the gap between MCM stack 30B and package 14, which may provide additional mechanical connection between MCM stack 30B and package 14 and/or provide electrical isolation of connection pads 48, 50 and conduction bumps 52.

Stacking of dice 12 in a MCM stack 30A, 30B presents several challenges over examples where a single die is disposed within a single-chip package. For example, MCM stack 30A, 30B comprises more electrical connection points than a single-chip package because MCM stack 30A, 30B comprises a plurality of dice 12 rather than a single die. Moreover, the electrical connections are located in close proximity to each other due to the stacking of dice 12 such that a structure within MCM stack 30A, 30B may interfere with electrical connection to one of the dice 12, as shown in FIGS. 1 and 3. For example, electrical connection to connection pads 38B of second die 12B may be relative difficult if shield 18B and or third die 12C obstruct access to connection points of die 12B, such as connection pads 38B, which may make it difficult to maneuver an electrical connection member, such as a wirebond wires 44B, into electrical connection with an electrical connection point, such as connection pads 38B. Also, as described in more detail below, it may be relatively difficult to provide a magnetic shielding arrangement of shields 18 to accommodate all of plurality of dice 12.

Dice 12 are protected from stray magnetic fields by at least two magnetic shields 18. Each magnetic shield 18 is configured to provide magnetic shielding for the circuit(s) 16 of each die 12. In one example, at least one of the magnetic shields 18 is located within package 14. In another example, one or more shields 18 are located within package 14, while one or more shields 18 are located on an outside surface of package 14 such as on an exterior surface 58 of lid 28 or an exterior surface 60 of base 20.

In one example, each magnetic shield 18 comprises a material having a relatively soft, high magnetic permeability compared to that of dice 12 and the magnetically-sensitive materials of circuit 16. The material of shields 18 may also have relatively low coercivity and relatively high saturation magnetization relative to the magnetically-sensitive materials of circuit 16. Examples of materials that may be used in magnetic shields 18 include, but are not limited to, iron-based alloys, nickel-iron based alloys such as NiFe, NiFeMo, NiFeCu, permalloy, supermalloy, or Mu metal, cobalt-iron based alloys, nickel-cobalt based alloys, or amorphous ferromagnetics. Examples of materials that may be suitable for use in shields 18 are the nickel-iron alloy sold under the brand name MUMETAL (Carpenter Technology Corp., Wyomissing, Pa.), the nickel-iron-molybdenum alloy sold under the brand name MUSHIELD (MuShield Company, Londonderry, N.H.), and the iron-chromium based alloy sold under the brand name METGLAS (Metglas, Inc., Conway, S.C.).

In one example, each shield 18 comprises one or more layers of material having a high magnetic permeability. In one example, a particular shield 18, as it is described in this disclosure, may comprise multiple layers of the same or different shielding material. Shield layers positioned adjacent to one another, with or without an adhesive material to mechanically join the adjacent layers, may be referred to as a single "shield 18" in some examples. For example, shield 18B (FIG. 1) between die 12B and die 12C may comprise two or more separate magnetic shielding layers that are all located between die 12B and 12C. In one example, magnetic shields 18 comprise a previously manufactured magnetic film or sheet that comprises a high-permeability material. The premade film or sheet can be cut to a desired size (described in more detail below) and mechanically coupled to (e.g., adhered) to a surface, such as with a dispensed adhesive material 19, such as an epoxy, or a preformed adhesive material, such as a pressure-sensitive adhesive.

In one example, at least two of the plurality of stacked integrated circuit dice 12 are positioned between the at least two magnetic shields 18. In one example, at least two of the plurality of stacked integrated circuit dice 12 are adjacent to each other without one of the magnetic shields 18 being between them. In another example, the ratio of integrated circuit die 12 to magnetic shields 18 within the package is 2:1 or greater.

Providing at least two dice 12 between the at least two shields 18 may allow for volumetric efficiency over electronics devices where each die has a corresponding shield, while still providing for adequate shielding against stray magnetic fields. An electronics device in which at least two dice 12 are positioned between at least two shields 18 may have other advantages as well. For example, the final device 10, 20 may be thinner than a device having more shields (e.g., magnetic shields between each die of the MCM), allowing the same functional chip stack to be provided in a smaller package 14.

In addition, in some cases, devices 10, 20 may be manufactured easier, cheaper, faster, and more reliably because there are fewer parts that need to be assembled during packaging. The increased efficiency, speed, and reliability may also result in a corresponding increase in the yield of devices 10, 20 manufactured. In addition, a device 10, 20 comprising fewer shields 18 has fewer components and less mass, and, as a result, in some examples, finished device 10, 20 may be more easily incorporated into existing reliability testing processes.

Reliability tests are generally performed on electronics devices to ensure there reliability in certain situations. Examples of reliability testing include testing of mechanical reliability, such as vibration, shock, and particle noise tests, which are sometimes referred to as "shake, rattle, and roll tests," and thermal testing to test reliability in high temperature environments. Some reliability tests are standardized. For example, mechanical reliability testing has been standardized by the JEDEC Solid State Technology Association as JEDEC standard JESD22-B103B and by the United States Military as Military standard MIL-STD-883. Some standardized reliability tests may not be modified to accommodate the extra components or mass from the addition of magnetic shields to an electronics device. Moreover, the fewer components and lower mass may result in a testing process that is more efficient and less likely to result in a test failure, for example because there are fewer components and material that can fail one of the reliability tests.

Some mechanical reliability tests include vibrating a device at a specified intensity for a specified period of time. The reduced mass resulting from providing more than one die 12 between the at least two shields 18 may result in less energy needed to conduct the shake, rattle, and roll test, and also results in less likelihood of the device failing the test or being damaged by the vibrations of the test. Similarly, the reduced number of components and the reduced amount of shielding material may allow for fewer complications during thermal testing, such as fewer components to account for differences in thermal expansion.

In one example, shown in FIG. 1, a first shield 18A is mounted on an external surface 60 of package base 20 (outside of cavity 24), such as with an adhesive 19A, while a pair of second shields 18B, 18C is placed within cavity 24 of package 14. In one example, one second shield 18B is placed between second die 12B and third die 12C, such as by being mounted to front side 32B of second die 12B with adhesive 19B and/or back side 24C of third die 12C with adhesive 19B, while another second shield 18C is placed on front side 32D of fourth die 12D, such as by being mounted to front side 32D with an adhesive 19C. In such an arrangement, first die 12A and second die 12B are protected from stray magnetic fields by shield 18A on one side and by magnetic shield 18B on the other, while third die 12C and fourth die 12D are protected from stray magnetic fields by shields 18A, 18B on one side and by shield 18C on the other (see, e.g., FIG. 4B).

In another example, shown in FIG. 2, a first shield 18A is mounted on external surface 60 of package base 20, such as with adhesive 19A, while a second shield 12C is placed on front side 32D of fourth die 12D, such as by mounting shield 18D to front side 32D with adhesive 19D. In such an arrangement, first die 12A, second die 12B, third die 12C, and fourth die 12D are positioned between first shield 18A and second shield 18D so that all four dice 12A, 12B, 12C, 12D are protected from stray magnetic fields by shield 18A and shield 18D. As shown in FIG. 2, shield 18D within package 14 has a larger width $W_D$ than the width $W_B/W_C$ of shields 18B, 18C shown in FIG. 1, which may help compensate for the use of a single shield 18D within package 14 to protect dice 12A, 12B, 12C, 12D, as in FIG. 2, rather than a pair of shields 18B, 18C within package 14 to collectively protect dice 12A, 12B, 12C, 12D, as in FIG. 1. In some examples, shield 18D may also have a slightly larger thickness $T_D$ compared to the thickness $T_B/T_C$ of shields 18B and 18C, as can be seen in FIGS. 1 and 2.

Configurations of shields 18 and 12 other than those shown in FIGS. 1 and 2 may be used. For example, a MCM stack may comprise a shield positioned between first die 12A and second die 12B, or a shield positioned between third die 12C and fourth die 12D. In one example, the electronics device may comprise a shield positioned on an exterior surface of the package, such as shield 18A on package base 20 (FIGS. 1 and 2) and a pair of shields positioned within the package with one of the shields being positioned between first die 12A and second die 12B and the other shield being positioned between third die 12C and fourth die 12D.

Magnetic shields 18 provide protection against stray magnetic fields by drawing the stray magnetic fields through the shield 18 itself, rather than the magnetic field passing through dice 12, where the stray magnetic field can adversely affect circuit(s) 16, such as by altering data stored in a MRAM memory circuit. In one example, the relatively high permeability of the material with which magnetic shields 18 are comprised causes at least some of the magnetic fields to which devices 10, 20 are exposed to be drawn into shields 18 rather than through the dice 12.

FIGS. 4A and 4B are conceptual representations of the shielding effect provided by shields 18. FIG. 4A depicts an example device 70 with no shields provided where a stray magnetic field 72 is passing through device 70. As can be seen in FIG. 4A, magnetic field 72, which is represented conceptually by magnetic field lines 74, passes through dice 12A, 12B, 12C, 12D. If dice 12 include a circuit comprising a magnetically-sensitive material, magnetic field 72 may adversely affect the circuit. FIG. 4B depicts a device 10 that includes shields 18A, 18B, which are configured to help protect IC dice 12 against stray magnetic field 72. FIG. 4B depicts the same example shielding arrangement as in FIG. 1, wherein a first shield 18A is placed on an external surface 60 of package base 20, while a pair of second shields 18B, 18C are positioned within cavity 24 of package 14. As shown in FIG. 4B, shields 18A, 18B, 18C draw magnetic field 72 into shields 18A, 18B, 18C, thereby limiting the extent to which dice 12A, 12B, 12C, 12D are exposed to magnetic field 72. This may, in turn, help protect magnetically-sensitive circuit 16 within dice 12A, 12B, 12C, 12D from any adverse affects of magnetic field exposure.

The dimensions of each shield 18 may depend on several factors, including the spacing between the particular shield 18 and the die or dice 12 that are to be protected by the particular shield 18, the number of dice 12 that are to be protected by the particular shield 18, the cross-sectional area of the dice 12 to be protected by shield 18, the strength of the stray magnetic field (magnetic flux) that is desired to be protected against, the permeability of the shield material, and the saturation magnetization of the shield material. In some examples, the dimensions of a particular magnetic shield may be selected based on Maxwell's equations, which may help provide a quantification of the shielding effect of particular dimensions and positioning of a shield 18. For example, shield 18A in FIG. 1, which is positioned on an external surface 60 of package base 20, is spaced from dice 12 by base 20. Therefore, shield 18A has a width $W_A$ that is substantially larger than the width $W_{Die}$ of dice 12. As the width $W_A$ of shield 18A increases, the surface area of shield 18A that is available to draw a magnetic field into shield 18A increases. In this way, the larger surface area of shield 18A may help compensate for a stronger magnetic field or for a larger distance between shield 18A and the die 12 being protected.

The larger surface area of shield 18A may also provide a path of less resistance for the magnetic field such that the magnetic field will tend to be drawn into shield 18A rather than passing through dice 12. Shield 18A may also have a thickness $T_A$ that is greater than the thickness of a shied that is closer to the dice 12 it is protecting, such as shields 18B, 18C in FIG. 1 that is mounted directly onto a die 12B, 12D. Similar to a larger width $W_A$, a larger thickness $T_A$ may provide shield 18A with more shielding material, which may help compensate for a stronger magnetic field or for a larger distance between shield 18A and the die 12 being protected. In contrast, shield 18D shown in FIG. 2 is within package 14 and is positioned directly on one of the plurality of IC dice 12 (e.g. on die 12D). Because of its closer proximity to dice 12 compared to shield 18A, shield 18D may have a smaller width $W_D$ and a smaller thickness $T_D$ while still providing sufficient shielding for dice 12.

In the example of FIGS. 1 and 2, shield 18A may be used to provide magnetic shielding of all four dice 12A, 12B, 12C, 12D in MCM 30B. Because of this, shield 18A may have a larger width $W_A$ and/or a larger thickness $T_A$. In contrast, shields 18B and 18C may provide shielding primarily for two of the four IC dice 12, e.g., shield 18C is positioned to better shield dice 12C and 12D from magnetic fields compared to shield 18B. However, shields 18B, 18C are configured to shield against magnetic fields, regardless of where the magnetic fields would traverse in the absence of shields 18B, 18C from devices 10, 20. Thus, shield 18B, while being used to shield all four dice 12, receives assistance for shielding dice 12C and 12D from shield 18C and receives assistance for shielding dice 12A and 12B from shield 18A. For this reason, shields 18B and 18C may have a narrower width $W_B/W_C$ and thickness $T_B/T_C$ than the corresponding width $W_A$, $W_D$ and thickness $T_A$, $T_D$ of shields 18A and 18D. That is, shields 18A, 18B, 18C work together to shield IC dice 12 from stray magnetic fields.

In addition, because the proximity between a particular shield 18 and a particular die 12 may affect the shielding capability to protect the particular die 12, it is generally stated that the shields 18 that are closest to a particular die 12 are positioned or are used to provide shielding of the particular die 12. However, the shield 18 may provide some shielding effect for dice 12 other than the particular die 12 described. For example, as described above with respect to FIG. 1, shield 18C is positioned and sized to provide shielding for dice 12C and 12D due to their proximity to dice 12C and 12D. However, shield 18C may provide some shielding effect for dice 12A and 12B as well.

The strength of the stray magnetic field from which shields 18 protect IC dice 12 may also affect the dimensions of shields 18. For example, the thickness of shield 18 may be adjusted to accommodate the magnetic flux of the magnetic field. For example, a shield 18 that is configured to protect against a relatively high magnetic field strength may require a larger thickness T compared to a relative low magnetic field strength. In one example, the thickness of shields 18 may be between about 0.25 millimeters (10 mils) and about 0.75 millimeters (about 30 mils), for example about 0.5 millimeters (about 20 mils). The type of shielding material may also be able to account for the expected magnetic field strength and/or magnetic flux, such as by having a high magnetic permeability to account for an expected magnetic field having a high field strength or high magnetic flux.

Figure 5:
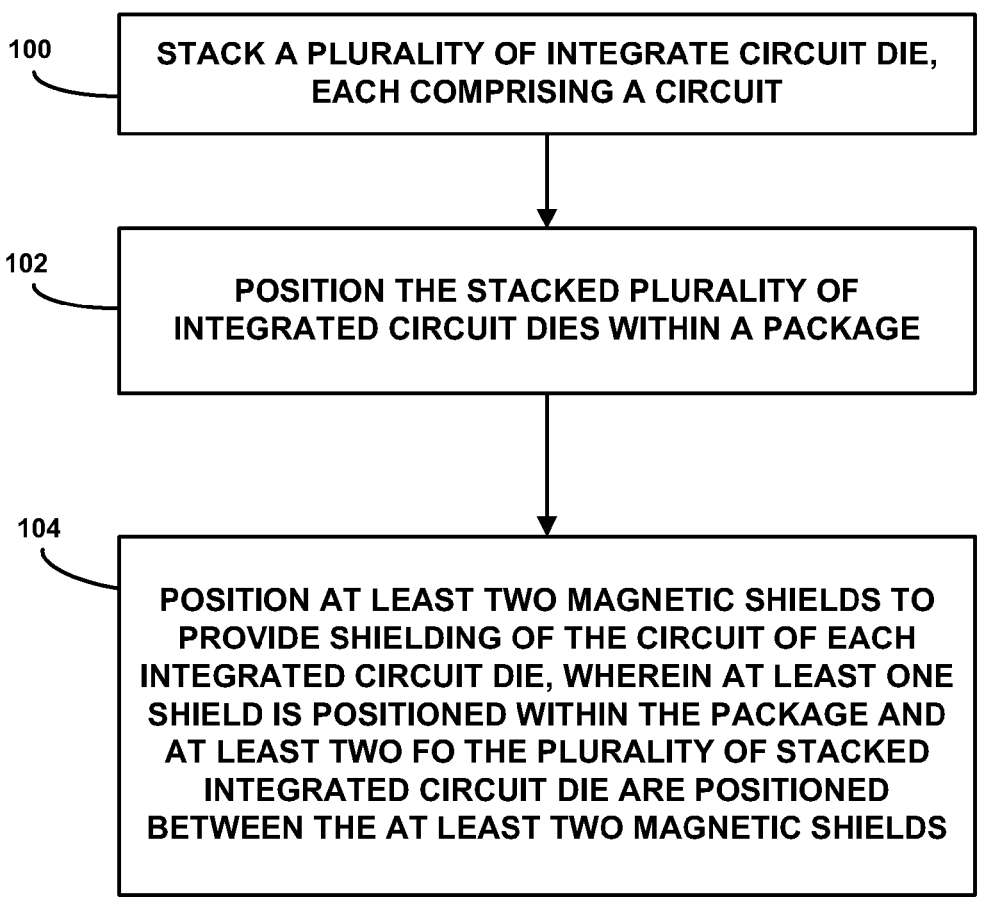
FIG. 5 is a flow diagram of an example method of making an example electronics device.

FIG. 5 is a flow diagram of an example method of manufacturing an electronics device, such as the example electronics devices 10, 20 shown in FIGS. 1-3. The example method of FIG. 5 comprises stacking a plurality of integrated circuit dice 12 (100), wherein each integrated circuit die 12 comprising at least one circuit 16, positioning the stacked plurality of integrated circuit dice 12 within a package 14 (102), and positioning at least two magnetic shields 18 to provide shielding for the at least one circuit 16 of each of the plurality of integrated circuit dice 12 (104). Positioning the magnetic shields 18 (104) comprises positioning at least one of the magnetic shields 18 within the package 14. Moreover, at least two of the plurality of stacked integrated circuit dice 12 are positioned between the at least two magnetic shields 18.

This disclosure refers to illustrative examples that are not meant to be construed in a limiting sense. Various modifications of the illustrative examples, as well as additional examples in line with the disclosure, will be apparent to persons skilled in the art upon reference to this description.

The invention claimed is:

1. A system comprising:
    a plurality of stacked integrated circuit dice, each integrated circuit die comprising at least one circuit;
    a package configured to receive the plurality of stacked integrated circuit dice; and
    at least two magnetic shields configured to magnetically shield the at least one circuit of each die of the plurality of stacked integrate circuit dice;
    wherein at least one of the magnetic shields is within the package; and
    wherein at least two dice of the plurality of stacked integrated circuit dice are positioned between the at least two magnetic shields.

2. The system of claim 1, wherein the package comprises a base and sidewalls that define a cavity, wherein the plurality of stacked integrated circuit dice are mounted in the cavity on the base.

3. The system of claim 2, wherein the package further comprises a lid that covers the cavity, wherein at least one of the at least two magnetic shields is positioned on an exterior surface of the lid.

4. The system of claim 1, wherein the plurality of stacked integrated circuit dice comprises a first integrated circuit die comprising a first side and a second side positioned on the package, a second integrated circuit die comprising a first side and a second side positioned on the first side of the first integrated circuit die, a third integrated circuit die comprising a first side and a second side positioned on the first side of the second integrated circuit die, and a fourth integrated circuit die comprising a first side and a second side positioned on the first side of the third integrated circuit die, wherein at least one of the at least two magnetic shields is positioned between the second integrated circuit die and the third integrated circuit die and another one of the at least two magnetic shields is positioned on the first side of the fourth integrated circuit die.

5. The system of claim 1, wherein the plurality of stacked integrated circuit dice comprises a first integrated circuit die having a first side and a second side positioned on the package, a second integrated circuit die having a first side and a second side positioned on the first side of the first integrated circuit die, a third integrated circuit die having a first side and a second side positioned on the first side of the second integrated circuit die, and a fourth integrated circuit die having a first side and a second side positioned on the first side of the third integrated circuit die, wherein at least one of the at least two magnetic shields is positioned on an outside surface of the package and another at least one of the at least two magnetic shields is positioned within the package.

6. The system of claim 5, wherein the at least one of the at least two magnetic shields placed within the package is positioned on the first side of the fourth integrated circuit die.

7. The system of claim 5, wherein the at least one of the at least two magnetic shields positioned within the package is positioned on the second integrated circuit die.

8. The system of claim 5, wherein the at least one of the at least two magnetic shields positioned within the package is positioned between the second integrated circuit die and the third integrated circuit die.

9. The system of claim 1, wherein the at least one package comprises a base and wherein at least one of the at least two magnetic shields is positioned on an exterior surface of the base.

10. The system of claim 1, wherein at least one of the at least two magnetic shields has a cross-sectional area that is larger than a cross-sectional area of each die of the plurality of stacked integrated circuit dice.

11. The system of claim 1, wherein the at least one magnetic shield positioned within the package defines at least one cutaway configured to provide access to a connection pad on at least one die of the plurality of integrated circuit dice.

12. A method comprising:
    stacking a plurality of integrated circuit dice, each integrated circuit die comprising at least one circuit;
    positioning the stacked plurality of integrated circuit dice within a package; and
    positioning at least two magnetic shields relative to the stacked plurality of integrated circuit dice, wherein at least one of the magnetic shields is positioned within the package, wherein at least two of the stacked plurality of integrated circuit dice are positioned between the at least two magnetic shields.

13. The method of claim 12, wherein the package comprises a base and sidewalls that define a cavity, wherein enclosing the stacked plurality of stacked integrated circuit dice within the package comprises mounting the stacked plurality of stacked integrated circuit dice in the cavity on the base.

14. The method of claim 12, wherein stacking the plurality of integrated circuit dice comprises:
    positioning a first integrated circuit die on the package, the first integrated circuit die comprising a first side and a second side, wherein the second side is mounted on the package;

positioning a second integrated circuit die on the first integrated circuit die, wherein the second integrated circuit die comprises a first side and a second side, wherein the second side of the second integrated circuit die is mounted on the first side of the first integrated circuit die;

positioning a third integrated circuit die on the second integrated circuit die, wherein the third integrated circuit die comprises a first side and a second side, wherein the second side of the third integrated circuit die is mounted on the first side of the second integrated circuit die; and positioning a fourth integrated circuit die on the third integrated circuit die, wherein the fourth integrated circuit die comprises a first side and a second side, wherein the second side of the fourth integrated circuit die is mounted on the first side of the third integrated circuit die, wherein positioning the at least two magnetic shields comprises positioning at least one of the at least two magnetic shields between the second integrated circuit die and the third integrated circuit die and positioning another one of the at least two magnetic shields on the first side of the fourth integrated circuit die.

15. The method of claim 12, wherein stacking the plurality of integrated circuit dice comprises:

positioning a first integrated circuit die on the package, the first integrated circuit die comprising a first side and a second side, wherein the second side is mounted on the package;

mounting a second integrated circuit die on the first integrated circuit die, wherein the second integrated circuit die comprises a first side and a second side, wherein the second side of the second integrated circuit die is mounted on the first side of the first integrated circuit die;

positioning a third integrated circuit die on the second integrated circuit die, wherein the third integrated circuit die comprises a first side and a second side, wherein the second side of the third integrated circuit die is mounted on the first side of the second integrated circuit die; and positioning a fourth integrated circuit die on the third integrated circuit die, wherein the fourth integrated circuit die comprises a first side and a second side, wherein the second side of the fourth integrated circuit die is mounted on the first side of the third integrated circuit die, wherein positioning the at least two magnetic shields comprises positioning at least one of the at least two magnetic shields on an exterior surface of the package and positioning another one of the at least two magnetic shields within the package.

16. The method of claim 15, wherein positioning one of the at least two magnetic shields within the package comprising positioning at least one magnetic shield on the first side of the fourth integrated circuit die.

17. The method of claim 15, wherein positioning at least one of the at least two magnetic shields within the package comprises positioning at least one magnetic shield between the second integrated circuit die and the third integrated circuit die.

18. The method of claim 12, wherein the package comprises a base and wherein positioning the at least two magnetic shields comprises positioning at least one of the at least two magnetic shields on an exterior surface of the base.

19. The method of claim 12, wherein at least one of the at least two magnetic shields has a cross-sectional area that is larger than a cross-sectional area of each of the plurality of stacked integrated circuit dice.

20. The method of claim 12, wherein the at least one magnetic shield positioned within the package defines at least one cutaway configured to provide access to a connection pad on at least one of the plurality of integrated circuit dice, the method further comprising electrically connecting the connection pad to a wire.

* * * * *

UNITED STATES PATENT AND TRADEMARK OFFICE
CERTIFICATE OF CORRECTION

PATENT NO.        : 8,415,775 B2
APPLICATION NO.   : 12/953133
DATED             : April 9, 2013
INVENTOR(S)       : Romney R. Katti Page 1 of 1

It is certified that error appears in the above-identified patent and that said Letters Patent is hereby corrected as shown below:

In the Claims

Column 12, Line 33 (Claim 9): says "wherein the at least one package", and should say --wherein the package--.

Signed and Sealed this
First Day of April, 2014

Michelle K. Lee
*Deputy Director of the United States Patent and Trademark Office*